US011316537B2

(12) United States Patent
Roth et al.

(10) Patent No.: US 11,316,537 B2
(45) Date of Patent: **\*Apr. 26, 2022**

(54) FAULT-TOLERANT ANALOG COMPUTING

(71) Applicant: HEWLETT PACKARD ENTERPRISE DEVELOPMENT LP, Houston, TX (US)

(72) Inventors: Ron Roth, Palo Alto, CA (US); John Paul Strachan, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 84 days.

This patent is subject to a terminal disclaimer.

(21) Appl. No.: 16/429,983

(22) Filed: Jun. 3, 2019

(65) Prior Publication Data

US 2020/0382135 A1    Dec. 3, 2020

(51) Int. Cl.
*H03M 13/11*    (2006.01)
*G06F 17/16*    (2006.01)

(52) U.S. Cl.
CPC ......... *H03M 13/1174* (2013.01); *G06F 17/16* (2013.01); *H03M 13/1105* (2013.01); *H03M 13/118* (2013.01)

(58) Field of Classification Search
CPC ......... H03M 13/1174; H03M 13/1105; H03M 13/118; H03M 13/6597; H03M 13/13; G06F 7/5443; G06F 17/16; G06F 2207/4824; G06F 2207/4828; G06J 1/00
See application file for complete search history.

(56) References Cited

U.S. PATENT DOCUMENTS

| 6,901,422 | B1 | 5/2005 | Sazegari |
| 8,352,847 | B2 | 1/2013 | Gunnam |
| 8,869,008 | B2 | 10/2014 | Baum et al. |
| 9,330,738 | B2 | 5/2016 | Taylor, Jr. |
| 10,380,386 | B1 * | 8/2019 | Strachan ............... G11C 13/00 |
| 10,452,472 | B1 * | 10/2019 | Graves ................ H03M 13/35 |

(Continued)

FOREIGN PATENT DOCUMENTS

WO    WO-2018132444 A1    7/2018

OTHER PUBLICATIONS

Gao et al., "Analog-Input Analog-Weight Dot-Product Operation with Ag/a-Si/Pt Memristive Devices;" IEEE; Pertinent pp. 1-6; 2012 (Year: 2012).*

(Continued)

*Primary Examiner* — Guy J Lamarre
(74) *Attorney, Agent, or Firm* — Nolte Lackenbach Siegel

(57) ABSTRACT

A fault-tolerant analog computing device includes a crossbar array having a number l rows and a number n columns intersecting the l rows to form l×n memory locations. The l rows of the crossbar array receive an input signal as a vector of length l. The n columns output an output signal as a vector of length n that is a dot product of the input signal and the matrix values defined in the l×n memory locations. Each memory location is programmed with a matrix value. A first set of k columns of the n columns is programmed with continuous analog target matrix values with which the input signal is to be multiplied, where k<n. A second set of m columns of the n columns is programmed with continuous analog matrix values for detecting an error in the output signal that exceeds a threshold error value, where m<n.

18 Claims, 5 Drawing Sheets

(56) References Cited

U.S. PATENT DOCUMENTS

| | | | |
|---|---|---|---|
| 10,545,821 B2* | 1/2020 | Roth | G11C 7/16 |
| 10,984,860 B2* | 4/2021 | Sharma | G11C 13/003 |
| 2005/0125477 A1 | 6/2005 | Genov et al. | |
| 2011/0029756 A1 | 2/2011 | Biscondi et al. | |
| 2012/0101622 A1 | 4/2012 | Yun et al. | |
| 2013/0343506 A1 | 12/2013 | Hisamatsu | |
| 2014/0082455 A1 | 3/2014 | Yosoku et al. | |
| 2014/0368455 A1 | 12/2014 | Croisonnier et al. | |
| 2016/0336064 A1 | 11/2016 | Seo et al. | |

OTHER PUBLICATIONS

Miao et al. "Dot-product engine as computing memory to accelerate machine learning algorithms;" IEEE; Pertinent pp. 374-379; 2016 (Year: 2016).*

Boser et al., "An Analog neural network processor with programmable topology", IEEE Journal of Solid-State Circuits, vol. 26, No. 12, 1991, pp. 2017-2025.

D.E. Knuth, "Efficient balanced codes", IEEE Transactions On Information Theory, vol. 32, No. 1, 1986, pp. 51-53.

Hoaradam et al., "Jacobsthal representation numbers", Fibonacci Quart., vol. 34, 1996, pp. 40-54.

Hu et al., "Dot-product engine for neuromorphic computing: Programming 1T1M Crossbar to accelerate matrix-vector multiplication", Proc. 53rd Annual Design Automation Conference (DAC'16), Austin, Texas, Article No. 19, Jun. 5-9, 2016, 7 pages.

Katona et al., "Greedy construction of nearly regular graphs," European J. Comb., 14 (1993), 213-229.

R.M. Roth, "Introduction to Coding Theory", Cambridge University Press, Cambridge, UK, 2006, 12 pages.

Shafiee et al., "ISAAC: A convolutional neural network accelerator with in-situ analog arithmetic in crossbars", ISCA '16 Proceedings of the 43rd International Symposium on Computer Architecture, 2016, pp. 14-26.

Avi Zanko et al., "Robust Turbo Analog Error Correcting Codes Based on Analog CRC Verification," IEEE Transactions on Signal Processing, Feb. 2015, pp. 757-770, vol. 64, No. 3, IEEE.

Kabatiansky, G. et al., On Codes Correcting Constant Number of Errors in L1 Metric, (Research Paper), 2015, 6 Pgs.

Li, J. et al., A Memristor Crossbar-Based Computation Scheme with High Precision, (Research Paper), Nov. 19, 2016, 6 Pgs.

* cited by examiner

FAULT-TOLERANT ANALOG COMPUTING

BACKGROUND

Vector-matrix computations are utilized in many applications including data compression, digital data processing, neural networks, encryption and optimization, among others. Hardware techniques for optimizing these computations have included the use of application specific integrated circuit ("ASICs"), field programmable gate arrays ("FPGAs"), graphics processing units ("GPUs"), and more recently, an analog dot product computing device based on a crossbar array. Error correction encoding and decoding for analog computing provide the ability to detect and correct computational errors when using an analog dot product computing device.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
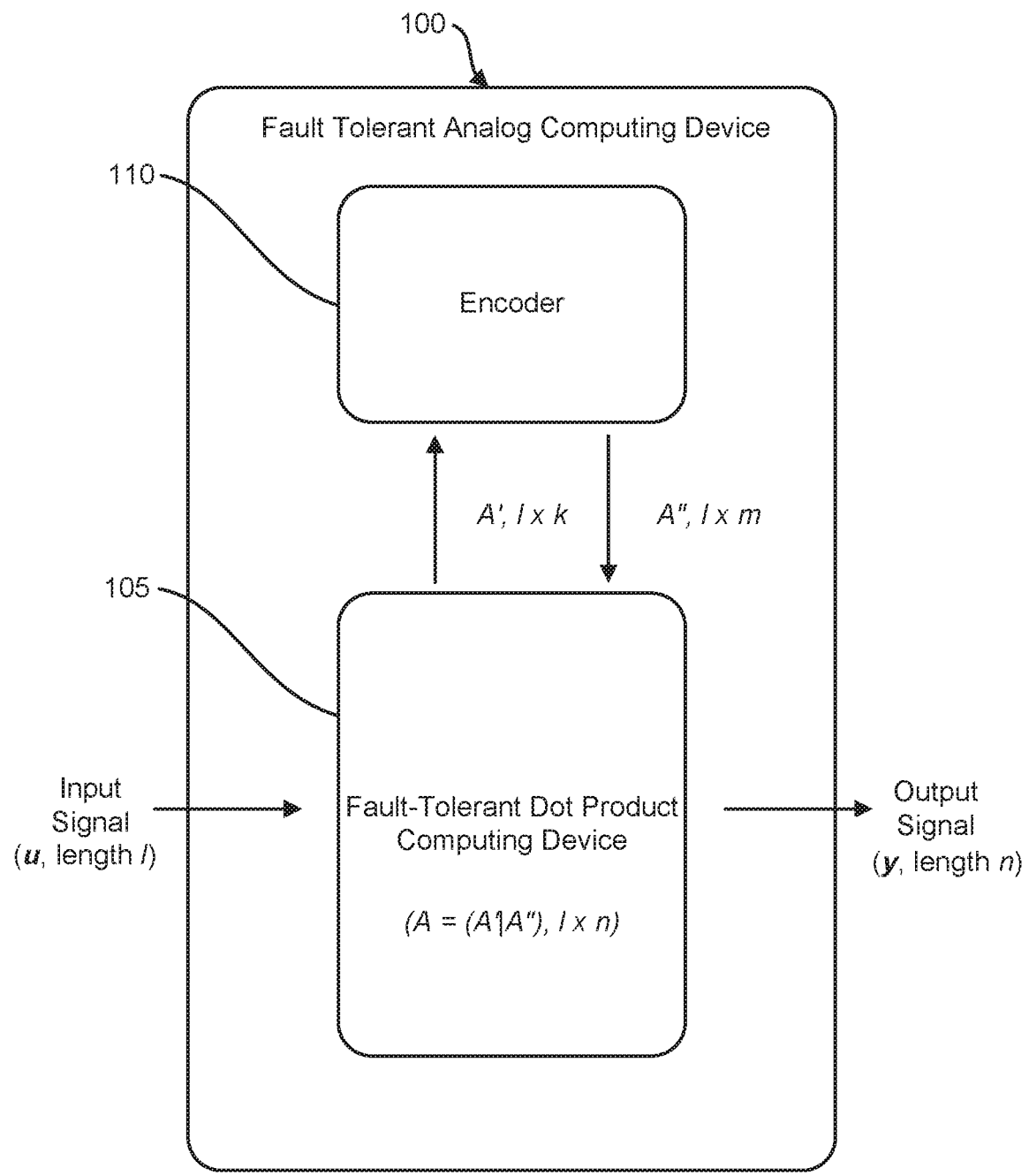
FIG. 1 schematically illustrates a fault-tolerant analog computing device, according to one or more examples of the disclosure.

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Analog computing devices based on crossbar arrays have proven to be efficient for a number of applications. A crossbar array, as used herein in, refers to an array having a number of row lines and a number of column lines intersecting the row lines to form a number of junctions, with memory devices coupled to the junctions and programmed with matrix values. An input value along each row of the crossbar array is weighted by the matrix values in each column and accumulated as an output from each column to form a dot product.

While crossbar arrays are efficient for analog computing, inaccuracies while programming the memory devices in the crossbar array and noise while reading the output can affect the accuracy of the computations. Inaccuracies may also arise at the junctions if they become shorted, non-programmable or stuck at an open state.

Attempts have been made to detect and correct computational errors in crossbar array computation outputs using error correction encoding and decoding. These attempts assume that the matrix values of the crossbar array are programmed with multi-bit digital integer values. Errors in the outputs are detected and corrected if they are at least one integer value off from an expected output value.

In practice, due to the imprecisions in analog computing devices, there may be some small errors in outputs that are acceptable and can be ignored. However, there may be outlyng errors in the output values that need to be corrected.

According to illustrative examples, a fault-tolerant analog computing device includes a crossbar array including a number l rows and a number n columns intersecting the l rows to form l×n memory locations. The crossbar array receives an input signal at the l rows and outputs an output signal at the n columns. The output signal is a dot product of the input signal and matrix values defined in the l×n memory locations. Matrix values of a first set of k columns of the crossbar array are programmed with continuous analog target matrix values with which the input signal is to be multiplied. Matrix values of a second set m of the n columns are programmed with continuous analog values for detecting and correcting errors in the output signal that exceed a threshold error value.

More precisely, the output signal may include a target output value, a tolerable bounded imprecision and an intolerable outlying error that exceeds a threshold error value. The tolerable bounded imprecision may be ignored, while the intolerable outlying error needs to be detected and/or corrected. The fault-tolerant analog computing device described herein tolerates imprecisions in computations performed by the crossbar array while detecting and/or correcting intolerable outlying errors in the output signal. It should be appreciated that "correcting" intolerable outlying errors in the output signal means locating the outlying errors and estimating the values of the outlying errors as described in further detail below.

FIG. 1 schematically illustrates a fault-tolerant analog computing device, according to one or more examples of the disclosure. The fault-tolerant analog computing device 100 includes a fault-tolerant dot product computing device 105 and an encoder 110. The fault-tolerant dot product computing device 105 receives an input signal corresponding to an input vector u of length l and generates an output signal corresponding to an output vector y of length n that is a dot product of the input signal u and an l×n matrix A. As described in more detail herein below, the matrix A is implemented as a crossbar array including l rows intersecting n columns to form l×n memory locations. In one example, the crossbar array may include l row conductors, n column conductors, and programmable memory devices at the junctions of the l rows and n columns, thereby forming l×n memory locations. Each memory location may be set to have a conductance value that is proportional to the matrix value at that memory location.

In one example, the memories at the junction in the crossbar array are formed of memristors. As referred to herein, a memristor is a resistor device whose resistance can be changed. If charge flows, or voltage is applied, in one direction through a memristor circuit, the resistance of the memristor will increase. If charge flows, or voltage is applied, in the opposite direction in the memristor circuit, its resistance will decrease. If the flow of charge is stopped by turning off the applied voltage, the memristor will "remember" the last resistance that it had. When the flow of charge starts again, the resistance of the memristor circuit memory cell will be what it was when it was last active.

Typically, this charge flow or voltage applied must be greater than a certain threshold in order to produce a significant change in the resistance value, for example in order to program a resistance value at each memory location. This threshold operation behavior allows vector-matrix computations to be performed on a dot product computing device below these threshold levels without materially altering the resistance values programmed into the memristor memory array. The crossbar array resistance values can subsequently be changed by a programming operation where the charge flow, or voltage, threshold is exceeded.

A memristive crossbar array has a number of rows and a number of column lines intersecting the row lines to form a number of junctions, with memristive memory devices coupled at the junctions and programmed with resistance values. An input voltage signal along each row of the crossbar array is weighted by the conductance of the memristive devices in each column and accumulated as the current output from each column to form a dot product. This is described in more detail below with reference to FIG. 3.

Inaccuracies while programming the memories at the junctions in the crossbar array and noise while generating the output signal can affect the accuracy of the dot product computation. Errors may also occur as a result of the junctions in the crossbar array becoming shorted due to faults in the programming process. In another example, a junction in the crossbar array may become non-programmable or get stuck in an open state. As a result of these errors, the actual output vector y may differ from the correct dot product uA between the input vector u and the matrix A.

In order to detect and/or correct for these errors, the matrix A is programmed to be fault-tolerant and self-protect the computations. As described in more detail herein below, the l×n matrix A is programmed to have the following structure:

$$A = (A' | A'') \qquad \text{(Eq. 1)}$$

where A' is an l×k matrix over a real field $\mathbb{R}$ consisting of a first set of k columns of A, and A" is a l×m matrix consisting of elements in $\mathbb{R}$ the remaining second set of m=n−k columns and generated by the encoder 110 prior to or while programming A' and A" into the crossbar array. In various examples, the encoder 110 is a dedicated circuit designed to operate according to a given error detection and correction capability. That is, the encoder 110 is implemented to encode each row of A" from the respective row in A'. so that errors above a threshold error value can be detected and corrected in the output vector y. Specifically, the actual output vector y can be expressed as:

$$y = c + \varepsilon + e \qquad \text{(Eq.2)}$$

where c represents the correct dot product uA between the input vector u and the values of the matrix A, ε is a tolerable imprecision, and e is vector whose nonzero entries are outlying errors. An outlying error is intolerable if it exceeds a threshold error value. Outlying errors below the threshold error value need not always be corrected. Outlying errors are "corrected" by locating nonzero entries in e and estimating values of the nonzero entries in e.

More precisely, the tolerable imprecision ε is a bounded imprecision that may be expressed as −δ<ε<δ for each entry in the vector ε. The vector e includes an entry that is an intolerable error that exceeds a threshold error value Δ, where Δ>δ.

The vector c=uA can be expressed as:

$$c = (c' | c'') \qquad \text{(Eq. 3)}$$

where c' is a vector of length k representing the result of the computation uA' and the vector c" is a vector of length m=n−k representing the result of the computation uA". It is appreciated that with A" generated by the encoder 110, the vector c" consists of redundancy symbols that can be used to detect and/or correct errors in the vector c', which therefore represents a target dot product computation. That is, the matrix A can be designed to contain a matrix A' of size l×k and a redundant matrix A" of a size l×m, with m=n−k depending on the desired error correction capability (threshold error value). The size of the redundant matrix A" with n−k columns depends on the desired number of correctable errors r and a threshold error value Δ.

Figure 2:
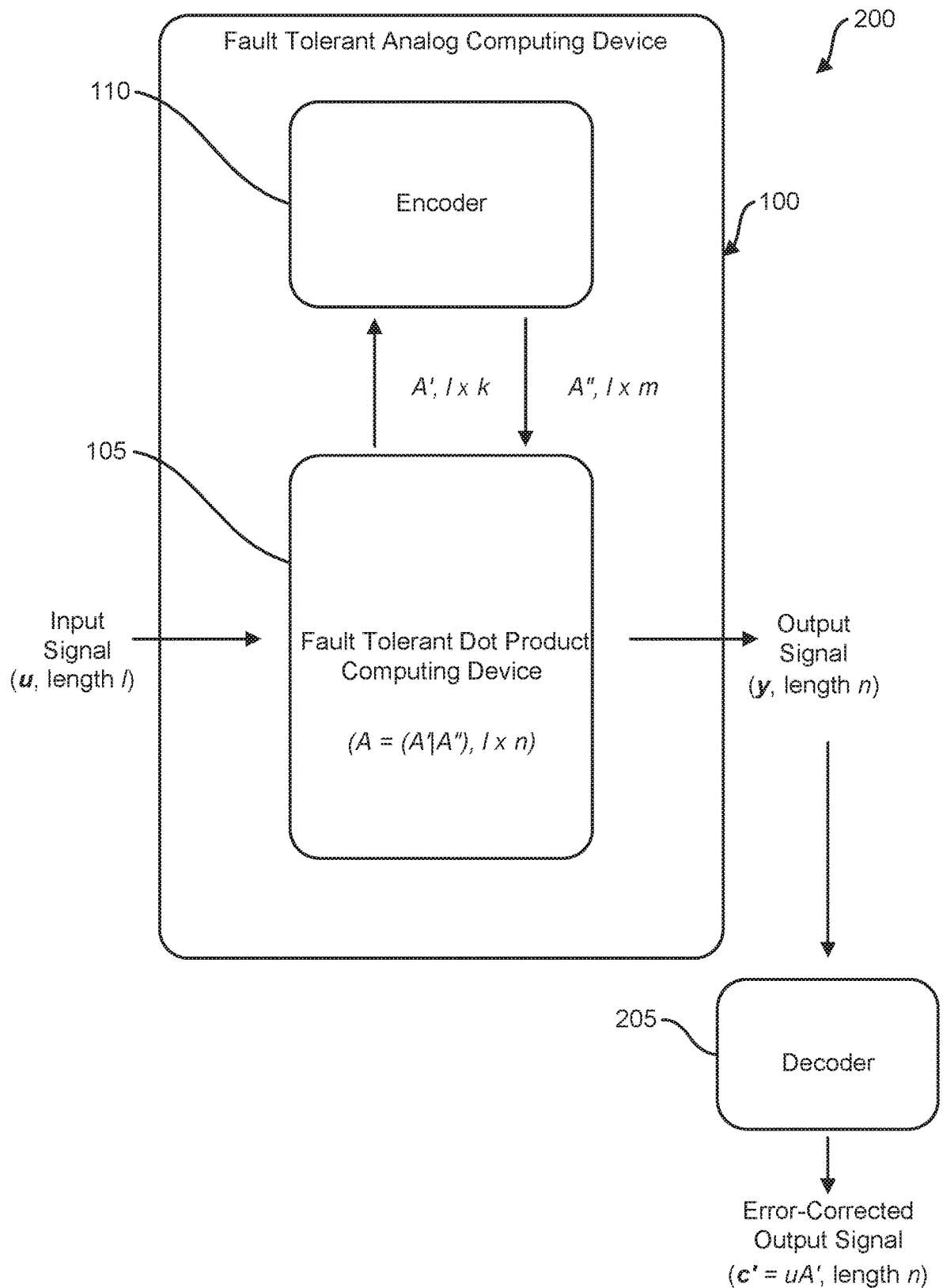
FIG. 2 schematically illustrates a system including a decoder for detecting and correcting errors in an output of a fault-tolerant analog computing device, according to one or more examples of the disclosure.

Referring now to FIG. 2, a schematic diagram of a system including a decoder for detecting and correcting errors in an output of a fault-tolerant analog computing device is described. The system 200 includes the fault-tolerant computing device 100 shown in FIG. 1 and described above. The system 200 also includes a decoder 205 to decode the output vector y to detect and correct an error that exceeds a threshold error value Δ. In various examples, the decoder 205 is a dedicated circuit designed to detect and correct errors in the output vector y that exceed the threshold error value Δ and generate an error-corrected output vector c'=uA'. Specifically, the decoder 205 uses the redundancy symbols in c" to produce the error-corrected output vector c'.

As noted above, "correcting" errors in the output vector y involves locating outlying errors in the output vector y, i.e., errors that exceed the threshold error value Δ, and estimating the values of the errors. It should be appreciated that the values of the errors may be estimated by giving lower and upper bounds on those values. The estimation of the values of outlying errors is explained in further detail below.

As described above, the threshold error value Δ that the decoder 205 is able to detect and/or correct depends on the design of the redundant matrix A". It is appreciated that the contents of the redundant matrix A" depend on A', but do not depend on the input signal u.

An encoding/decoding scheme for detecting and correcting errors that exceed a threshold error value may be understood by first explaining the decoding problem and then providing an example of encoding. Given a linear [n, k] coding function $\mathcal{C}$ over $\mathbb{R}$ (to which the rows of matrix A belong), a decoding function $\mathcal{D}$ is a defined for every y∈ $\mathbb{R}^n$, where $\mathcal{D}(y)$ is either a list of locations of outlying errors or a detection flag indicating that errors have occurred. Given δ, Δ, and prescribed nonnegative integers τ and σ, $\mathcal{D}$ corrects τ errors and detects additional a errors (with regard to the threshold pair (δ, Δ)) if the conditions set forth immediately below hold for every y, provided that the number of outlying errors does not exceed τ+σ.

The first condition (D1) is that the decoding function $\mathcal{D}$ must return a (possibly empty) set of outlying error locations when the number of outlying errors does not exceed τ.

The second condition (D2) is that when the decoding function $\mathcal{D}$ returns a list of outlying error locations (whether due to condition (D1) or otherwise), the returned set must include the locations of all outlying errors whose values exceed the threshold error value $\Delta$, i.e., outlying errors whose values are outside the range $\pm\Delta$. False alarms are not allowed, and a location should not be included in the returned list if it does not contain an outlying error.

It should be noted that there exists a "gray area" of outlying values which is not covered by the conditions (D1) and (D2). The decoder 205 is allowed to miss an outlying error if its value is within the range $\pm\Delta$. Hence, $\Delta$ should be selected to be as small as possible.

Given these conditions for the decoder 205, the task of decoding may be simplified for detection of a single outlying error (corresponding to taking T=0 and a=1). Decoding may be based on a parity-check matrix H.

A parity-check matrix H of a linear [n, k] coding function C over $\mathbb{R}$ is a matrix H of n columns and r rows over $\mathbb{R}$, such that $\{c \in \mathbb{R}^n : Hc^T = 0\}$. The rank of H equals n−k=m.

For detecting a single outlying error, given positive integers and n such that r≤n, let H be a real r×n matrix over $\{0,1\}$ that satisfies the following properties:
  (i) each column in H is a unit vector, i.e., it contains exactly one 1; and
  (ii) the number of 1s in each row is either $\lfloor n/r \rfloor$ or $\lceil n/r \rceil$.

For correcting a single outlying error, given positive integers r and n such that r S n≤r(r−1), let H be a real r×n matrix over $\{-1, 0, 1\}$ that satisfies the following properties:
  (i) all columns of H are distinct;
  (ii) each column in H contains exactly two nonzero entries, the first of which being a 1; and
  (iii) the number of nonzero entries in each row is either $\lfloor 2n/r \rfloor$ or $\lceil 2n/r \rceil$ It should be appreciated that the condition n≤r(r−1) is necessary for having such a matrix. Conversely, when r is even, such an H can be constructed for every n≤r(r−1).

The parity-check matrix H may be represented as:

$$H = (H'|H'') \quad \text{(Eq. 4)}$$

where H is a matrix consisting of the first n−r columns of H, and H" is a matrix consisting of the remaining r columns of H.

Encoding is performed based on a systematic parity-check matrix $H_{sys}$ (which is different from the parity-check matrix H). The systematic parity-check matrix $H_{sys}$ is an r×n matrix where r=n−k and takes the form:

$$H_{sys} = (B|I_r) \quad \text{(Eq. 5)}$$

where B is an r×k matrix and $I_r$ is an r×r identity matrix. Each row of A" is computed by the encoder 110 from the respective row in A'. Specifically, given a row vector a' of length k (such as any of the rows in the matrix A'), encoding is carried out by computing a vector a" (of length r=n−k) as follows:

$$a'' = a'B^T \quad \text{(Eq. 6)}$$

Then a=(a'|a") is a codeword of C by virtue of the fact that $H_{sys}a^T=0$. The sub-matrix H" has a close relationship with the parity-check matrix H. That is, the matrix B is given by:

$$B = (H')^{-1} H' \quad \text{(Eq. 7)}$$

Respectively, the systematic parity-check matrix $H_{sys}$ is given by:

$$H_{sys} = (H')^{-1} H \quad \text{(Eq. 8)}$$

For fast encoding, B should be a "simple" matrix, e.g., a sparse matrix. Accordingly, the matrix H' can be assumed to have a very simple structure.

For example, assuming a parity-heck matrix H constructed so that its last r columns are given by $$\begin{pmatrix} 1 & 1 \\ 1 & -1 \end{pmatrix}$$

$\otimes I_{r/2}$, where $\otimes$ stands for Kronecker product and $I_{r/2}$ is the identity matrix of order r/2. That is, the parity-check matrix H may be constructed so that the last r columns have the matrix $$\begin{pmatrix} 1 & 1 \\ 1 & -1 \end{pmatrix}$$

along the diagonal. For such a parity-check matrix H, rank(H)=r.

As an example, where r=4, n=12, a parity matrix H may be given by:

$$H = \begin{pmatrix} 1 & 1 & 1 & 1 & 0 & 0 & 0 & 0 & 1 & 1 & 0 & 0 \\ 0 & 0 & 0 & 0 & 1 & 1 & 1 & 1 & 1 & -1 & 0 & 0 \\ 1 & -1 & 0 & 0 & 1 & -1 & 0 & 0 & 0 & 0 & 1 & 1 \\ 0 & 0 & 1 & -1 & 0 & 0 & 1 & -1 & 0 & 0 & 1 & -1 \end{pmatrix}.$$

The matrix H" can then be assumed to have a simple structure, and, up to a factor of 2, the inverse of H" looks the same (in fact, it is also symmetric). That is:

$$(H'')^{-1} = \left(\frac{1}{2}\right) H'' = \frac{1}{2} \begin{pmatrix} 1 & 1 \\ 1 & -1 \end{pmatrix} \otimes I_{r/2}. \quad \text{(Eq. 9)}$$

It follows that the rows of B given by Eq. 7 are sums or differences of pairs of rows of H' (up to scaling by 2). This means that the nonzero entries in B are either $\pm\frac{1}{2}$ or 1, and their number is (at most) twice that number in H', which means that Bis sparse.

As described above, the matrix A' is encoded by the encoder 110 using a systematic parity-check matrix $H_{sys}$. An error in the output y from the fault-tolerant dot product computing device 105 may be detected and/or corrected by the decoder 205 using the parity-check matrix H as follows.

Let $\theta = \lceil 2n/r \rceil$, and $H = (h_j)$, where $h_j$ denotes a column j in H. For an output vector y from the fault-tolerant dot product computing device 105, the decoder 205 computes a syndrome s as:

$$s = Hy^T = (s_m) \quad \text{(Eq. 10)}$$

Computation of the syndrome $s_m$ returns a set containing one index t if the following three conditions hold:
  (U1) $s_m$ is not within $[-\theta, \theta]$ for exactly two values of m, e.g., $m_0$ and $m_1 > m_0$,
  (U2) $h_{m_0,t} = 1$,
  (U3) $h_{m_1,t} = \text{sign}(s_{m_0} - S_{m_1})$ Otherwise, the decoding function $\mathcal{D}$ returns an empty set.

Assuming that a is a tolerable imprecision and $e=(e_j)$ has at most one element with an error $>\Delta$ or $<-\Delta$), the following may be observed:

(i) If e=0, then each entry in $s=He^T$ is in the interval $[-\theta, \theta]$.
(ii) The syndrome s can have at most two nonzero entries outside $[-\theta, \theta]$.
(iii) If (exactly) two entries in s are outside $[-\theta, \theta]$, then their positions, e.g., $m_0$ and $m_1 > m_0$, uniquely determine by conditions (U2)-(U3) an index t for which $e_t \neq 0$.
(iv) If $|e_t| > 2\theta$ for some t, then there must be two entries in s outside $[-\theta, \theta]$.

These observations imply that the conditions (D1)-(D2) hold for $\Delta = 2\theta$.

As noted above, "correcting" an outlying error involves locating the error and estimating the value of the error given lower and upper bounds. For the case of single error correction, the lower and upper bounds on the (single) error value may be given as follows:

$$\max_{i \in [2]} \{s_{m_i} \cdot h_{m_i,t} - \|H_{m_i}\|^2 \cdot \delta\} \leq e \leq \min_{i \in [2]} \{s_{m_i} \cdot h_{m_i,t} + \|H_{m_i}\|^2 \cdot \delta\} \quad \text{(Eq. 11)}$$

where $H_m$ denotes row m in H and $\|\cdot\|$ stands for the $L_2$-norm. The values of these upper and lower bounds are output by the decoder 205 as estimates of the detected error value.

In the example described above, encoding is based on the systematic parity-check matrix $H_{sys}$ while syndrome computation for decoding is performed using the parity-check matrix H. While this entails separate circuits, this is not a downside since the encoding is carried out while programming the crossbar, while syndrome computation is done in each reading by the decoder 205.

In another example, the same circuitry may be used both for encoding and syndrome computation in decoding. Eqs. 6 and 7 imply that:

$$a'' = -a'H^T(H''^T)^{-1} \quad \text{(Eq. 12)}$$

The vector $a'H'^T$ can then be computed by the same circuitry that computes the syndrome s by placing (a'/0) instead of y in Eq. 10, followed by multiplication by $(H'')^{-1} = (\frac{1}{2})H'$. Such re-use of the same circuitry may be advantageous in many applications.

Figure 3:
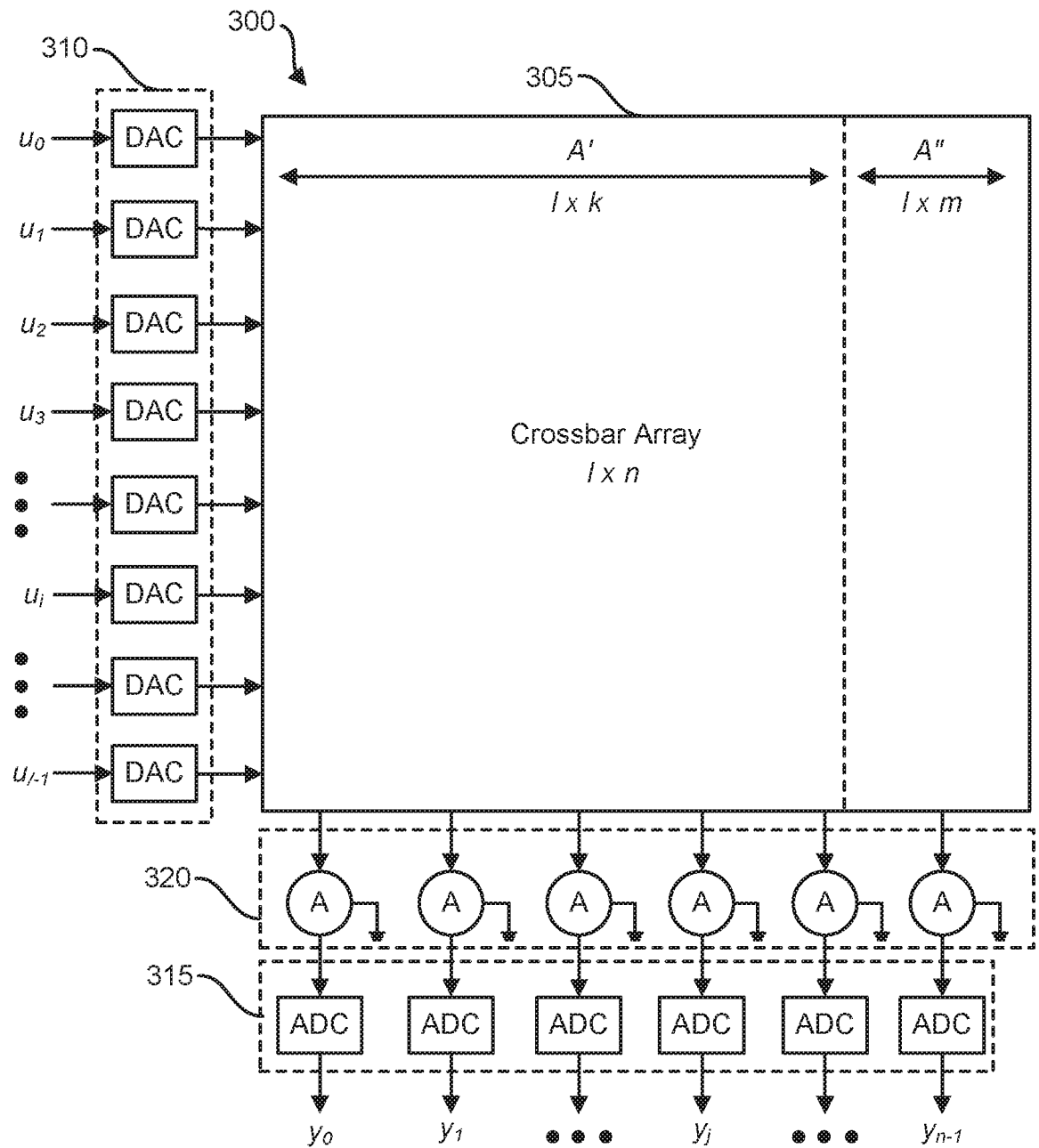
FIG. 3 schematically illustrates a fault-tolerant dot product computing device, according to one or more examples of the disclosure.

Referring now to FIG. 3, a schematic diagram of a fault-tolerant dot product computing device is illustrated, according to one or more examples of the disclosure. The fault-tolerant dot product computing device 300 includes a memristive crossbar array 305. The memristive crossbar array 305 has a number l rows and a number n columns intersecting the l rows to form l×n memory locations, with each memory location having a programmable memristive element and defining a matrix value. Each memory location is set to have a conductance value that is proportional to the matrix value at that memory location.

The fault-tolerant dot product computing device 300 also includes a number l of digital-to-analog converters ("DACs") 310 coupled to the rows of the memristive crossbar array 305 to receive an input signal u and a number n of analog-to-digital converters ("ADCs") 315 coupled to the column lines of the memristive crossbar array 305 to generate an output signal y. As described above, the output signal y is a dot product of the input signal u and the matrix values in the memristive crossbar array 305. The matrix values in the memristive crossbar array 305 represent values in a matrix A expressed as in Eq. 1 above, where A' is a l×k matrix consisting of the first k columns of A, and A" is an encoded l×m matrix consisting of the remaining m=n−k columns.

Each entry of the input vector u is fed into a DAC to produce a voltage level that is proportional to $u_i$. The dot product, c=uA, is then computed by reading the currents at the grounded column conductors 320, after being fed into the ADCs 315. The grounded column conductors 320 may be, for example, transimpedance amplifiers A. Any errors in the computed dot product c=uA, output as a vector y, above a threshold error value can then be detected and/or corrected by a decoder as described above. Alternatively, the currents at the grounded column conductors 320 may be fed directly to a decoder for error detection and correction, without being converted to digital form.

Figure 4:
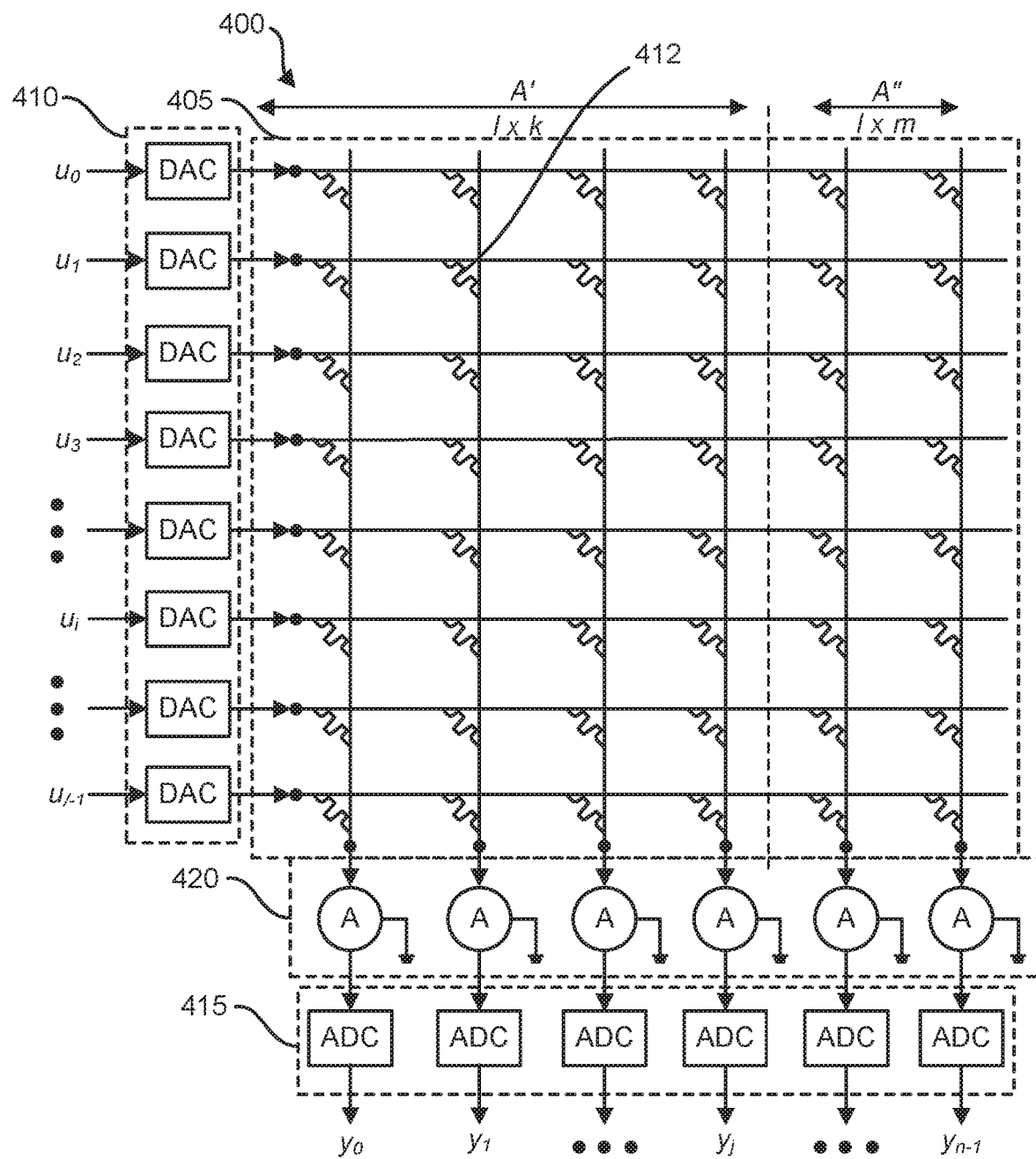
FIG. 4 schematically illustrates a fault-tolerant dot product computing device in more detail, according to one or more examples of the disclosure.

Attention is now directed at FIG. 4, which shows a schematic diagram of a fault-tolerant dot product computing device in more detail according to one example. The fault-tolerant dot product computing device 400 is designed to be substantially similar to the fault-tolerant dot product computing device 300 shown in FIG. 3. The fault-tolerant dot product computing device 400 includes a memristive crossbar array 405 where memristive elements or memristors are disposed at junctions intersecting and electrically coupling rows and columns in the memristive crossbar array 405.

Conductance channels in the memristors of memristive crossbar array 405 may be formed in each of the memristors, such as, for example, memristor 412 (only one indicated). A crossbar can be thought of as an array of memristors that connect each wire in one set of parallel wires (e.g., the rows) to every member of a second set of parallel wires (e.g., the columns) that intersect the first set. In the example of FIG. 4, the rows and the columns are perpendicular with respect to each other, but the rows and the columns may intersect at any angle.

The memristors in memristive crossbar array 405 may be built at the micro- or nano-scale level and used as a component in a wide variety of electronic circuits, such as, for example, bases for memories and logic circuits. When used as a basis for memories, the memristors in memristive crossbar array 405 may be used to store information in the form of resistance values. When used as a logic circuit, the memristors may be employed to represent bits in a field programmable gate array, as the basis for a wired-logic programmable logic array, or, as described herein, as the basis in the fault-tolerant dot product computing device 400. The memristors in memristive crossbar array 405 may also find use in a wide variety of other applications. Further, the memristors in memristive crossbar array 405 may be fabricated through any reasonably suitable fabrication process, such as, for example, chemical vapor deposition, sputtering, etching, lithography, or other methods of forming memristors.

The memristive crossbar array 405 further receives a number of input values indicated as input signal u, converted to analog values by DACs 410. The input values may be read signals used to read the resistance values at each individual memristor at each junction in the memristive crossbar array 405, and as a way to multiply a matrix value by a vector value at each memristor involved in the calculation. The read signals (or vector signals) may be applied as second input values to the rows of the memristive crossbar array 405. The vector signals may represent a vector to be multiplied by the matrix represented by programming signals. In one example, the vector signals have a relatively lower voltage value than the first voltages used to program the memristors such that the voltage level applied by the vector signals does not change the resistance values of the memristors as programmed by the first voltages. The vector signals act as read signals in this manner by not changing the resistance values of the memristors.

The vector signals interact with the memristors at their respective junctions, and the resulting current is collected at the end of each column line by grounded column conductors 420 that act as analog current measuring devices. The grounded column conductors may be, for example, transimpedance amplifiers A. The current measured by the grounded column conductors 420 may then be converted into digital values by the ADCs 415 to form the output vector y. Alternatively, the current measured by the devices 420 may be fed directly to a decoder for error detection and/or correction. In various examples, an initial signal may be applied to the memristors before application of the programming signals and the vector signals in order to set the resistivity of the memristors to a known value.

Although the crossbar arrays illustrated and described above with reference to FIGS. 3 and 4 include memristors as memory devices at junctions in the crossbar array, it should be appreciated that other types of memory devices may be used. Examples of such memory devices include but are not limited to flash memory, spin-transfer torque ("STT") random access memory ("RAM"), magnetic tunnel junction ("MTJ") RAM, phase-changed memories, etc.

Figure 5:
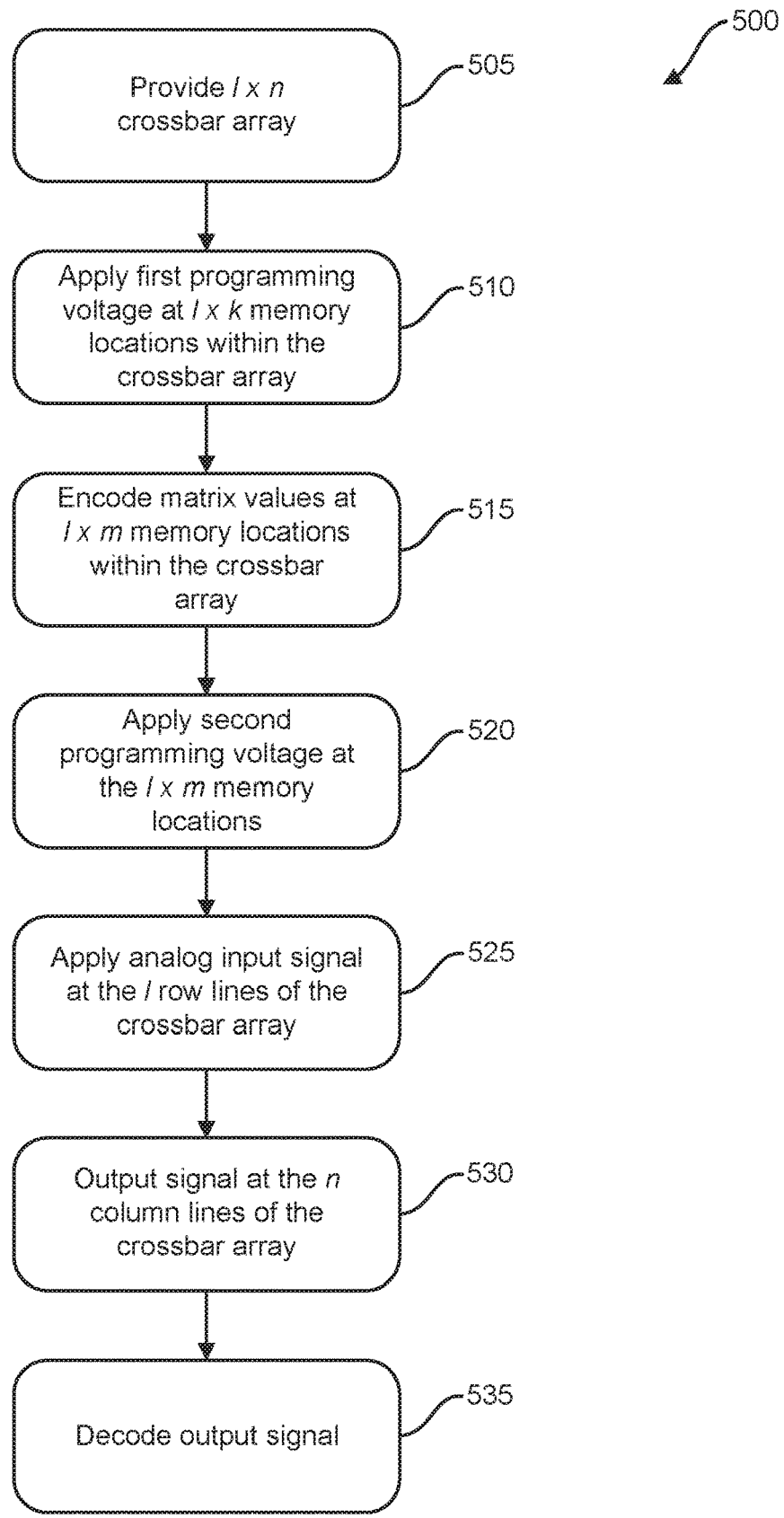
FIG. 5 depicts a method for computing a dot product that is fault-tolerant according to one or more examples of the disclosure.

Referring now to FIG. 5, a method for computing a dot product that is fault-tolerant according to one or more examples of the disclosure is now described. The method 500 includes providing a crossbar array having a number l rows and a number n columns intersecting the l rows to form l×n memory locations at 505. In one example, each memory location in the crossbar array has a programmable memristive element and defines a matrix value. A programming voltage is applied to the memristive element at each of the l×k memory locations, where k<n, to set the matrix values at each of the l×k memory locations at 510. The matrix value at each memory location is thus proportional to the conductance of the memristive element in that memory location.

In order to provide fault tolerance in the crossbar array, the crossbar array is designed with additional memory locations to introduce redundancy in the dot product computation that can be used to detect and/or correct errors in the computation. As described above, this is implemented by encoding matrix values at l×m memory locations within the crossbar array from the continuous analog matrix values at the l×k memory locations, where n=k+m, for detecting an error that exceeds a threshold error value at 515. The encoding is performed by an encoder coupled to the crossbar array. The encoded matrix values are then programmed into the l×m memory locations by applying a programming voltage at each l×m memory location at 520.

As a result of steps 505-520, a fully programmed l×n fault-tolerant crossbar array is provided to perform an analog dot product computation with an input signal. An input signal is applied at the l row lines of the crossbar array at 525. The input signal corresponds to an input vector of length l to be multiplied by the matrix values at the l×n memory locations. The input vector signal interacts with the memristive elements at their respective memory locations, and the resulting current is collected at the end of each column. An output signal is then output at the n columns of the crossbar array at 530. The output signal corresponds to an output vector of length n that is a dot product of the input vector and the matrix values at the l×n memory locations. The output signal is decoded at 535 to detect an error exceeding a threshold error value. Decoding at 535 may also correct a detected error, i.e., locate an outlying error exceeding the threshold error value and estimate the value of the outlying error as described above.

According to illustrative examples, an error detection and correction scheme for an analog computing device is provided that detects and corrects errors in an output that exceed an intolerable threshold error value, while tolerating small imprecisions. This scheme is suitable for applications that are insensitive to controlled inaccuracies, e.g., computations that are based on a model which only estimates a true behavior, such as in learning applications. The degree of error detection and/or correction may be dynamically varied depending on the application. Accordingly, computational precision may be adjusted on a per-layer basis, such as in neural network computations, where some lower layers can be much less precise than higher layers.

The foregoing description, for purposes of explanation, used specific nomenclature to provide a thorough understanding of the disclosure. However, it will be apparent to one skilled in the art having the benefit of this disclosure that more specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A fault-tolerant analog computing device, comprising:
a crossbar array having a number l rows and a number n columns intersecting the l rows to form l×n memory locations, the crossbar array programmable with l×n continuous analog target matrix values at the l×n memory locations,
wherein the l rows of the crossbar array receive an input signal as a vector of length l, and the n columns output an output signal as a vector of length n that is a dot product of the input signal and the l×n continuous analog target matrix values programmed in the l×n memory locations,
wherein a first set of k columns of the n columns is programmed with continuous analog target matrix values with which the input signal is to be multiplied, where k<n, and
wherein a second set of m columns of the n columns is programmed with continuous analog matrix values for detecting, locating, and estimating an error in the output signal that exceeds a threshold error value, where m<n.

2. The fault-tolerant analog computing device of claim 1, wherein the matrix values in the second set of m columns are encoded based on the matrix values in the first set of k columns in the crossbar array, where k=n −m.

3. The fault-tolerant analog computing device of claim 2, wherein the matrix values in the m columns are encoded using a systematic parity-check matrix.

4. The fault-tolerant analog computing device of claim 3, wherein the systematic parity-check matrix has r rows and n columns, where r=m.

5. The fault-tolerant analog computing device of claim 1, wherein an error in the output signal that exceeds the threshold error value is detected by a decoder.

6. The fault-tolerant analog computing device of claim 5, wherein the detected error in the output signal is detected by the decoder using a parity-check matrix.

7. The fault-tolerant analog computing device of claim 6, wherein the detected error is located, and a value of the error is estimated by the decoder.

8. A method, comprising:
providing a crossbar array having a number l rows and a number n columns intersecting the l rows to form l ×n memory locations, the crossbar array programmable with l ×n continuous analog target matrix values at the l ×n memory locations;
applying a first programming voltage at each of the l ×k memory locations to set matrix values at the l ×k memory locations within the crossbar array as continuous analog target matrix values with which the input signal is to be multiplied, where k<n;
encoding continuous analog matrix values at l ×m memory locations within the crossbar array from the continuous analog target matrix values at the l ×k memory locations, where n=k+m, for detecting an error that exceeds a threshold error value;
applying a second programming voltage at each of the l ×m memory locations;
applying an input signal as an input vector of length l to the l rows of the crossbar array;
outputting an output signal from the crossbar array that is a dot product of the input vector and the matrix values at the l ×n memory locations as an output vector of length n at the n columns of the crossbar array; and
wherein the matrix values at the l ×m memory locations are encoded using a systematic parity-check matrix.

9. The method of claim 8, wherein the systematic parity-check matrix has r rows and n columns, where r=m.

10. The method of claim 8, further comprising decoding the output signal to detect the error in the output signal that exceeds the threshold error value.

11. The method of claim 10, wherein decoding the output signal is further to locate the detected error and estimate a value of the detected error.

12. The method of claim 10, wherein the output signal is decoded using a parity-check matrix.

13. A system, comprising:
a crossbar array having a number l rows and a number n columns intersecting the l rows to form l ×n memory locations, the crossbar array programmable with l×n continuous analog target matrix values corresponding to the l ×n memory locations, wherein the l rows of the crossbar array receive an input signal as a vector of length l, and the n columns output an output signal as a vector of length n that is a dot product of the input signal and the l×n continuous analog target matrix values programmed in the l×n memory locations;
an encoder coupled to the crossbar array to generate continuous analog matrix values for a number m columns of the n columns for detection of an error in the output signal that exceeds a threshold error value based on matrix values of k columns of the n columns, where n=k+m, and wherein the matrix values of the k columns are continuous analog target matrix values with which the input signal is to be multiplied.

14. The system of claim 13, wherein the encoder generates the matrix values for the m columns using a systematic parity-check matrix.

15. The system of claim 14, wherein the systematic parity-check matrix has r rows and n columns, where r=m.

16. The system of claim 13, further comprising:
a decoder to decode the output signal to detect the error in the output signal that exceeds the threshold error value.

17. The system of claim 16, wherein the decoder is further to decode the output signal to locate the detected error and estimate the value of the detected error.

18. The system of claim 16, wherein the decoder decodes the output signal using a parity-check matrix.

* * * * *

UNITED STATES PATENT AND TRADEMARK OFFICE
CERTIFICATE OF CORRECTION

PATENT NO. : 11,316,537 B2
APPLICATION NO. : 16/429983
DATED : April 26, 2022
INVENTOR(S) : Ron M. Roth and John Paul Strachan It is certified that error appears in the above-identified patent and that said Letters Patent is hereby corrected as shown below:

On the Title Page

Item (72), the first inventor should be changed from "Ron Roth" to "Ron M. Roth."

Signed and Sealed this
Twenty-eighth Day of March, 2023

Katherine Kelly Vidal
*Director of the United States Patent and Trademark Office*